(12) United States Patent
Sun et al.

(10) Patent No.: US 9,140,975 B2
(45) Date of Patent: Sep. 22, 2015

(54) EUV PELLICLE FRAME WITH HOLES AND METHOD OF FORMING

(71) Applicant: GLOBALFOUNDRIES Inc., Grand Cayman, KY (US)

(72) Inventors: Lei Sun, Albany, NY (US); Chanro Park, Clifton Park, NY (US); Wenhui Wang, Clifton Park, NY (US); Hui Zang, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 19 days.

(21) Appl. No.: 14/106,219

(22) Filed: Dec. 13, 2013

(65) Prior Publication Data

US 2015/0168824 A1 Jun. 18, 2015

(51) Int. Cl.
| | | |
|---|---|---|
| G03F 1/62 | (2012.01) | |
| G03F 1/64 | (2012.01) | |
| G03F 1/00 | (2012.01) | |
| G03F 1/22 | (2012.01) | |

(52) U.S. Cl.
CPC ........ *G03F 1/142* (2013.01); *G03F 1/22* (2013.01); *G03F 1/62* (2013.01); *G03F 1/64* (2013.01)

(58) Field of Classification Search
CPC .............. G06F 1/142; G06F 1/62; G06F 1/64
USPC ............................................................ 430/5
See application file for complete search history.

(56) References Cited

U.S. PATENT DOCUMENTS

| | | | |
|---|---|---|---|
| 8,383,297 B2 * | 2/2013 | Shirasaki et al. | 430/5 |
| 2011/0235016 A1 * | 9/2011 | Shirasaki | 355/75 |

* cited by examiner

*Primary Examiner* — Christopher Young
(74) *Attorney, Agent, or Firm* — Ditthavong & Steiner, P.C.

(57) ABSTRACT

A method of forming an improved EUV mask and pellicle with airflow between the area enclosed by the mask and pellicle and the area outside the mask and pellicle and the resulting device are disclosed. Embodiments include forming a frame around a patterned area on an EUV mask; forming a membrane over the frame; and forming holes in the frame.

16 Claims, 7 Drawing Sheets

BACKGROUND

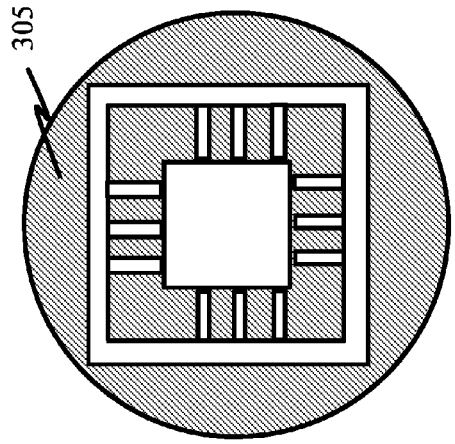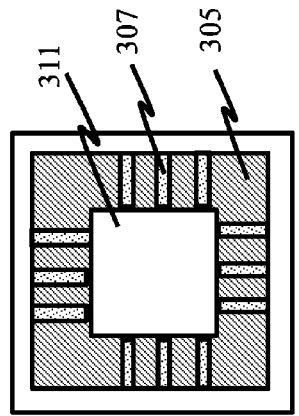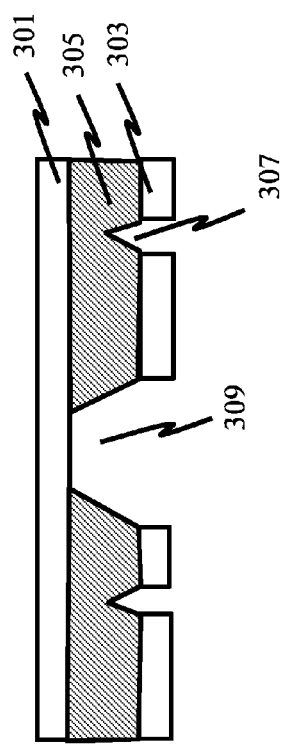

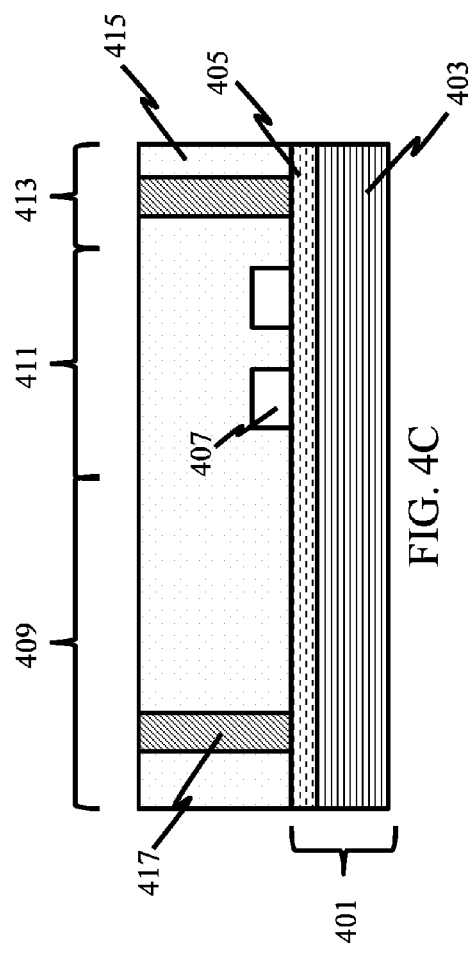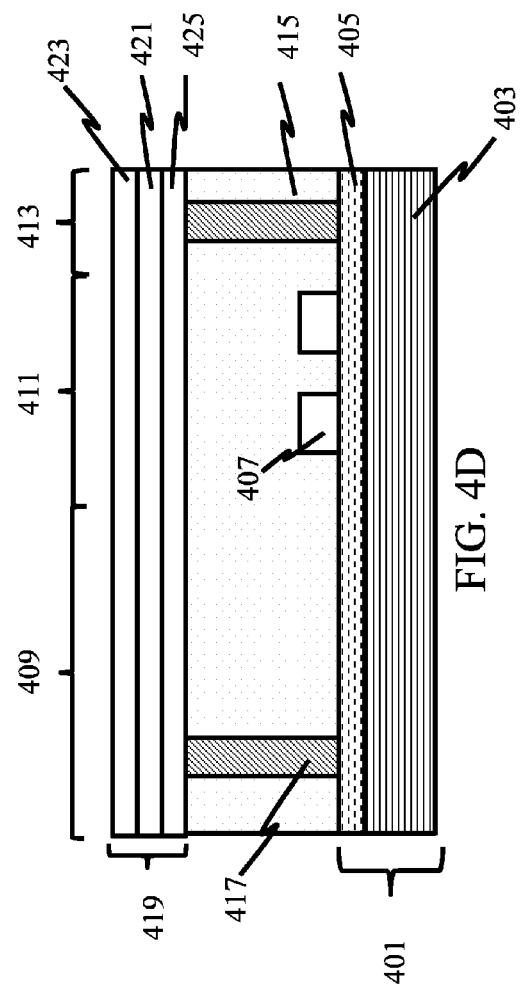

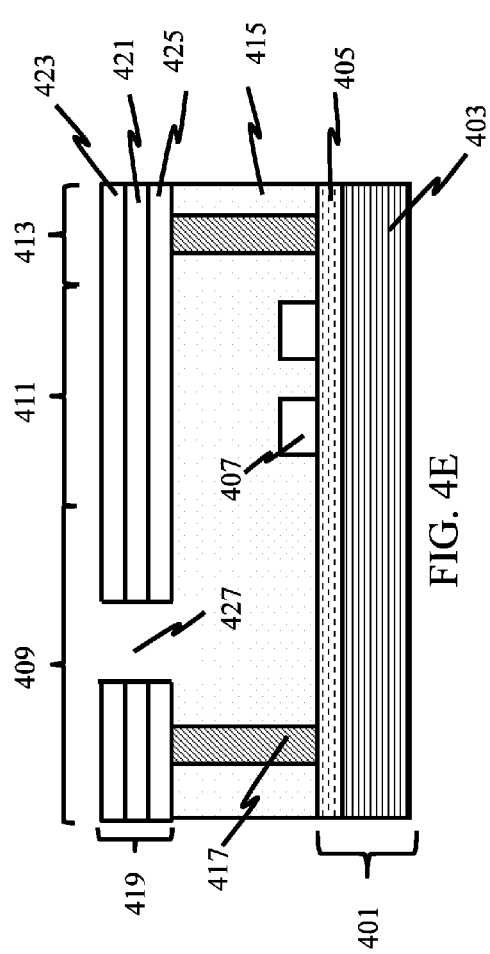
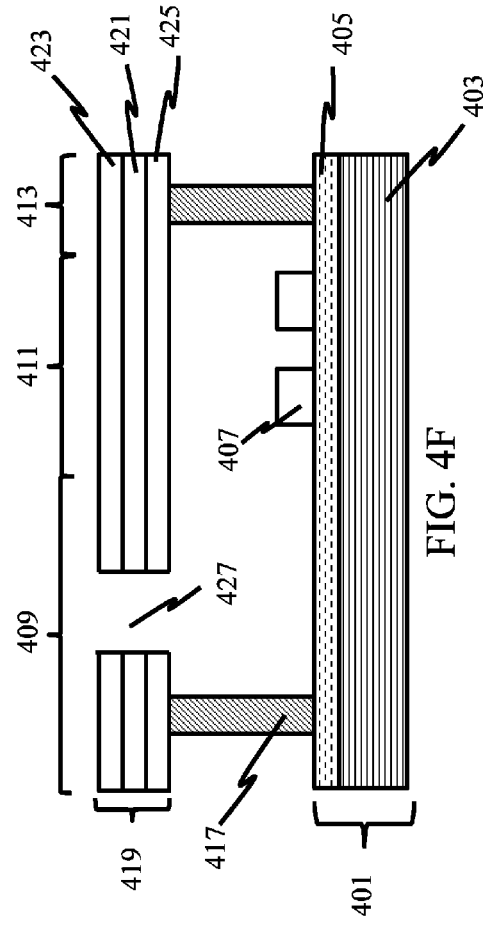
FIG. 4E
FIG. 4F

EUV PELLICLE FRAME WITH HOLES AND METHOD OF FORMING

TECHNICAL FIELD

The present disclosure relates to extreme ultraviolet (EUV) masks. In particular, the present disclosure relates to the mounting of pellicles on EUV masks, particularly for the 7 nanometer (nm) technology node and beyond.

BACKGROUND

Two major issues for EUV lithography (EUVL) manufacture are low source power and defective pellicles. A pellicle is employed in deep ultraviolet lithography (DUVL) to block particles from the mask pattern surface. The pellicle is placed several millimeters (mm) from the pattern plane, such that particles on the pellicle are out of focus, and, therefore, cannot be imaged. An EUV pellicle must have EUV transmission of at least 90% for a single pass and 81% for a double pass, and must have an open area of at least 110 by 142 $mm^2$. However, since most materials absorb EUV wavelengths, building an effective pellicle for an EUV mask is difficult. One attempt to build a pellicle involved etching a membrane onto a wafer. However, the resulting pellicle, a film having a diameter of 80 mm and a film thickness of 25 nm, only achieved 86% single pass transmission. Further, the membrane was very fragile, which increases cost.

Even if a pellicle were formed with the proper specifications, mounting the pellicle onto an EUV mask also poses problems. For example, as illustrated in FIG. 1, a membrane 101 and silicon frame 103 are etched on a wafer (not shown for illustrative convenience) and then transferred to EUV mask 105 having a pattern area 107, such that the mask, membrane (the pellicle), and frame form a closed or semi-closed area. The membrane is thin, having a thickness 109 of tens of nanometers (nm), and has an area of 110 by 142 mm, and the silicon frame has a height 111 of at least several mm. If the air flow between the inside of the closed area and outside the closed area is not smooth and the air pressure difference on the two sides of the membrane is large, the thin membrane may be damaged. The mask is stored in normal air pressure, but when it is mounted into the EUV scanner, it must be vacuumed. Further, when the mask is shipped by air, there will also be air pressure changes.

A need therefore exists for methodology enabling fabrication of an EUV mask having a pellicle mounted thereto with sufficient air flow between the space enclosed between the mask and the pellicle and the space outside the mask and pellicle and for the resulting mask. Another need is to directly fabricate pellicle onto the EUV mask so the pellicle is not damaged during mounting on the EUV mask.

SUMMARY

An aspect of the present disclosure is a method of forming holes in a frame mounting a pellicle to an EUV mask.

Another aspect of the present disclosure is an EUV mask with a pellicle mounted thereto via a frame having holes therethrough.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a frame around a patterned area on an extreme ultraviolet (EUV) mask; forming a membrane over the frame; and forming holes in the frame.

Aspects of the present disclosure include forming the holes to a width of 1 to 10,000 micrometers (μm). Further aspects include forming holes in the membrane. Another aspect includes forming the holes in the frame and in the membrane by a litho-etch-litho-etch (LELE) process. Additional aspects include forming the frame, membrane, and holes by: forming a silicon nitride (SiN) layer on opposite surfaces of a silicon (Si) substrate; etching the SiN layer on the second surface, forming a pattern; etching the Si substrate through the pattern, forming an opening in the Si through to the SiN layer on the first surface and forming holes partially through the Si, wherein Si remaining after etching forms the frame, and a portion of the SiN layer on the first surface over the opening forms the membrane. Other aspects include the opening and the holes being tapered. Further aspects include forming a sacrificial layer over the EUV mask including over the patterned area; forming holes in the sacrificial layer, down to the EUV mask, between the frame and the patterned area; and forming pillars in the holes, prior to providing the membrane over the frame. Other aspects include forming a hole in the membrane down to the sacrificial layer, between the frame and the patterned area; and removing the sacrificial layer. Another aspect includes removing the sacrificial layer by ion etching. Additional aspects include forming the sacrificial layer of a material having an etch selectivity different from the pillars, the frame, and the membrane, such as of carbon (C), silicon dioxide ($SiO_2$), SiN, or an organic material.

Another aspect of the present disclosure is a device including: a frame around a patterned area on an extreme ultraviolet (EUV) mask; a membrane over the frame; and holes in the frame.

Aspects include the holes having a width of 1 to 10,000 μm. Further aspects include holes in the membrane. Other aspects include: the frame including Si; and the membrane including a SiN layer. Additional aspects include the holes being tapered, and a tapered opening in the silicon over the patterned area. Another aspect includes pillars between the frame and the patterned area. Further aspects include the number of pillars ranging from 3 to 1000. Other aspects include the membrane including a layer of Si or SiN between two layers of ruthenium (Ru).

Another aspect of the present disclosure is a method including: forming a frame around a patterned area on an EUV mask; forming a sacrificial layer of C, $SiO_2$, SiN, or an organic material over the EUV mask including over the patterned area; forming holes in the sacrificial layer, down to the EUV mask, between the frame and the patterned area; forming pillars in the holes; forming a pellicle over the frame, the pellicle comprising a Si or SiN layer between two Ru layers; forming a hole in the pellicle down to the sacrificial layer between the frame and the patterned area; and removing the sacrificial layer by ion etching through the hole; and forming additional holes in the pellicle and in the frame.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure.

Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 3A through 3E schematically illustrate formation of an EUV mask and pellicle with holes in the pellicle frame, in accordance with an exemplary embodiment;

FIGS. 4A through 4G schematically illustrate formation of an EUV mask and pellicle with holes in the pellicle frame, in accordance with another exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of insufficient air flow between the space enclosed between an EUV mask and a pellicle and the space outside the mask and pellicle attendant upon mounting a pellicle to an EUV mask via a solid frame. In accordance with embodiments of the present disclosure, holes are formed in the pellicle frame and in the pellicle. In addition, pillars may be formed for supporting the pellicle.

Methodology in accordance with embodiments of the present disclosure includes forming a frame around a patterned area on an EUV mask; forming a membrane over the frame; and forming holes in the frame.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
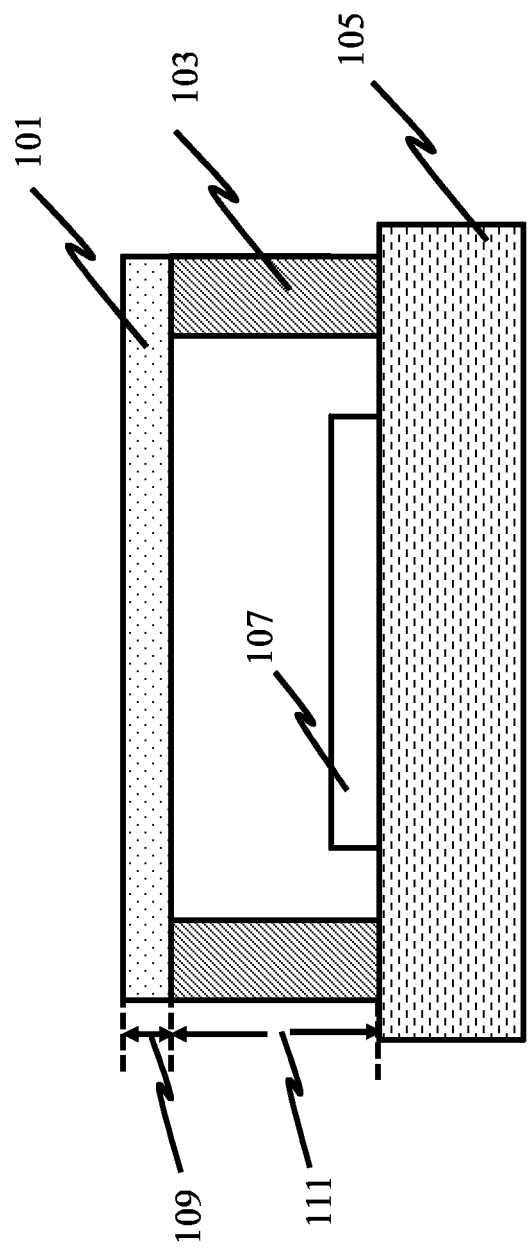
FIG. 1 schematically illustrates a typical EUV mask with a pellicle mounted thereto.
Figure 2:
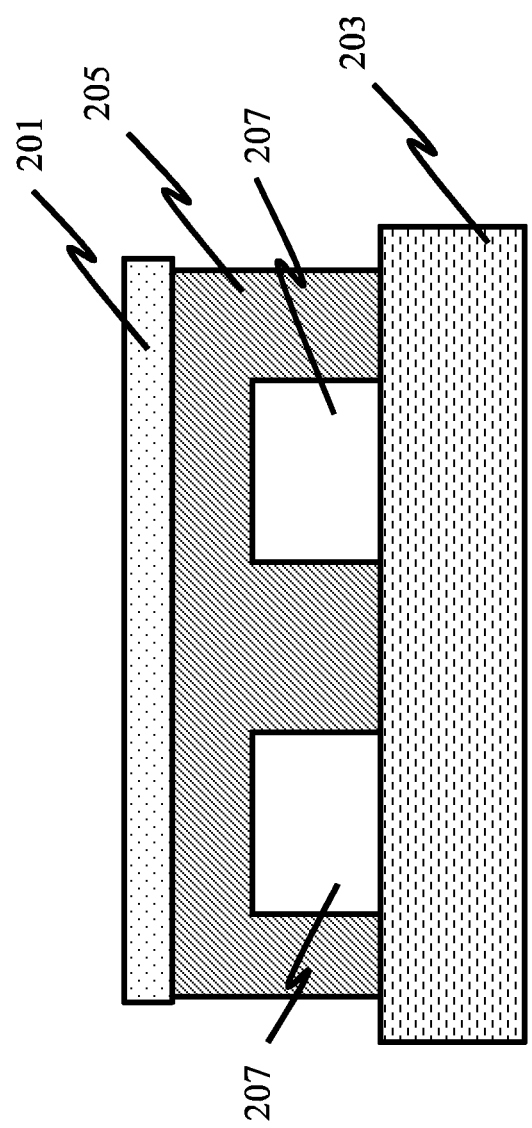
FIG. 2 schematically illustrates an EUV mask and pellicle with holes in the pellicle frame, in accordance with an exemplary embodiment.

Adverting to FIG. 2, an EUV mask with a pellicle and holes in the silicon frame is illustrated, in accordance with an exemplary embodiment. As illustrated, a membrane 201 is mounted to an EUV mask 203 with a silicon frame 205. Holes 207 are etched into the silicon frame 205. The size of the holes may range from 1 µm to 10 mm. Although the holes in FIG. 2 are shown as rectangular, the shape of the holes may be rectangular, triangular, square, or another shape. The number of holes on the frame is limited only in that the frame support must remain intact. Holes may additionally be formed in the membrane to aid airflow. The holes may be formed by a lithography-etch-lithography-etch (LELE) process, such as by etching holes in the frame with a first etch and etching holes in the membrane with the second etch.

A one-time etching method for forming holes in the frame is illustrated in FIGS. 3A through 3E. Adverting to FIG. 3A, SiN layers 301 and 303 are formed on opposite sides of a silicon substrate, or wafer, 305. A pattern is then etched in SiN layer 303, as illustrated in FIG. 3B. Next, the silicon substrate is etched using an anisotropic etch through the pattern in SiN layer 303, as illustrated in FIG. 3C. Holes 307 are thus formed partially through the silicon substrate, as well as diaphragm 309, which forms an opening in the silicon corresponding to the pellicle. As shown, the holes and the diaphragm are tapered. FIG. 3D illustrates the layout of silicon wafer 305 after etching the silicon in FIG. 3C, and FIG. 3E illustrates a top view of the result of the anisotropic etch of FIG. 3C. Specifically, FIG. 3E shows a silicon frame 305 (with etched SiN layer 303 under the Si frame), holes 307 through the silicon frame, and a SiN pellicle 311 formed from SiN layer 301 over diaphragm 309.

Figure 4A:
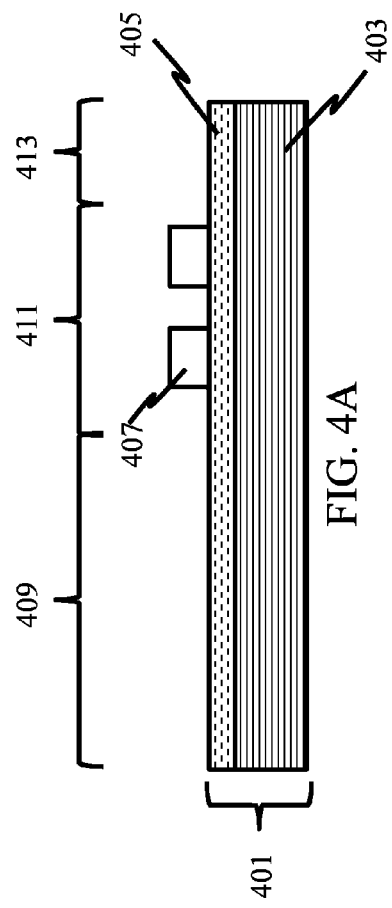

Adverting to FIGS. 4A through 4G, a method for forming an EUV mask with a pellicle etched directly on the EUV mask and holes in the silicon frame and pellicle is illustrated, in accordance with another exemplary embodiment. As illustrated in FIG. 4A, a conventional EUV mask 401, formed of at least one pair of a multilayer 403 and a Ru layer 405, is provided with a pattern 407 of tantalum nitride (TaN). Although shown as with a single pair of layers 403 and 405, a typical EUV mask may include 40 pairs of multilayer 403 and Ru layer 405. The EUV mask 401 includes an empty area 409, a pattern area 411, and another empty area 413. The pattern area 411 may, for example, be 5 mm to 33 mm, and the pellicle may be 6 mm to 40 mm.

Figure 4B:
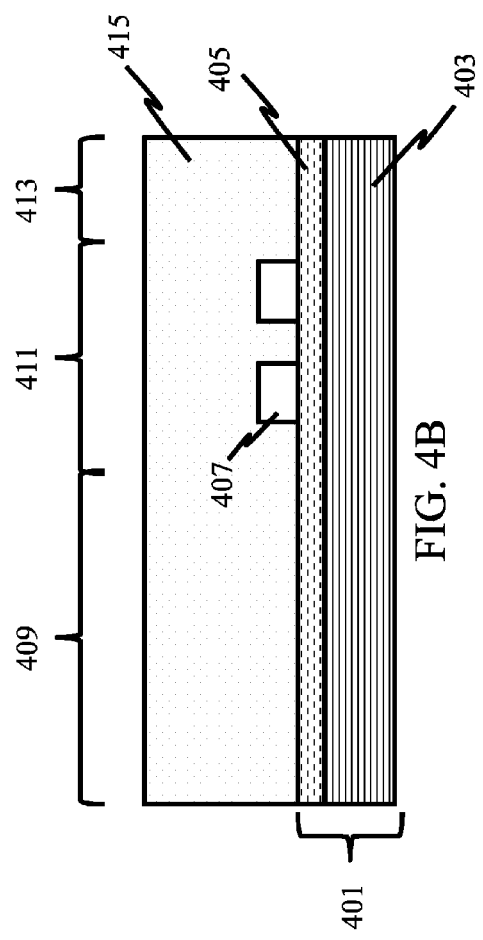

As illustrated in FIG. 4B, a sacrificial layer 415 of C is deposited over the pattern 407 and EUV mask 401. The sacrificial layer 415 may be formed to a thickness of 0.1 to 50 mm. Alternatively, the sacrificial layer 415 may be formed of $SiO_2$, SiN, or an organic material.

Holes are etched in the sacrificial layer 415 in empty areas 409 and 413, and pillars 417 are deposited in the holes, as illustrated in FIG. 4C. The holes may be etched by an LE process. The pillars may be formed of Si, copper (Cu), or ceramic, or any material that has a different etch selectivity than the sacrificial layer 415. The diameter of the pillars may range from tens of µm to mm, depending on the area of empty space 409 and 413, and the number of pillars may range from 3 to 1000, or the size of the pillar may range from 1 to 10% of that of the empty area.

Adverting to FIG. 4D, a pellicle 419 is deposited over sacrificial layer 415. Pellicle 419 is formed of a Si layer 421, with Ru layers 423 and 425 on opposite sides thereof for protecting the Si layer. The Si layer 421 may be formed to a thickness of 10 to 60 nm, and Ru layers 423 and 425 may each be formed to a thickness of 1 to 5 nm, for example 2.5 nm. The main layer of the pellicle, layer 421 is formed of Si because of its transparency at EUV wavelengths. SiN can also be used in layer 421.

A hole 427 is then etched through pellicle 419, down to sacrificial layer 415, in the empty area 409 or 413, as illustrated in FIG. 4E. The hole may be etched depositing a resist (not shown for illustrative convenience) over pellicle 419, patterning a hole in the resist, and lithographically etching the hole in the pellicle through the hole in the resist. As illustrated in FIG. 4F, next the sacrificial layer 415 is removed, for example by ion etching through hole 427.

Figure 4G:
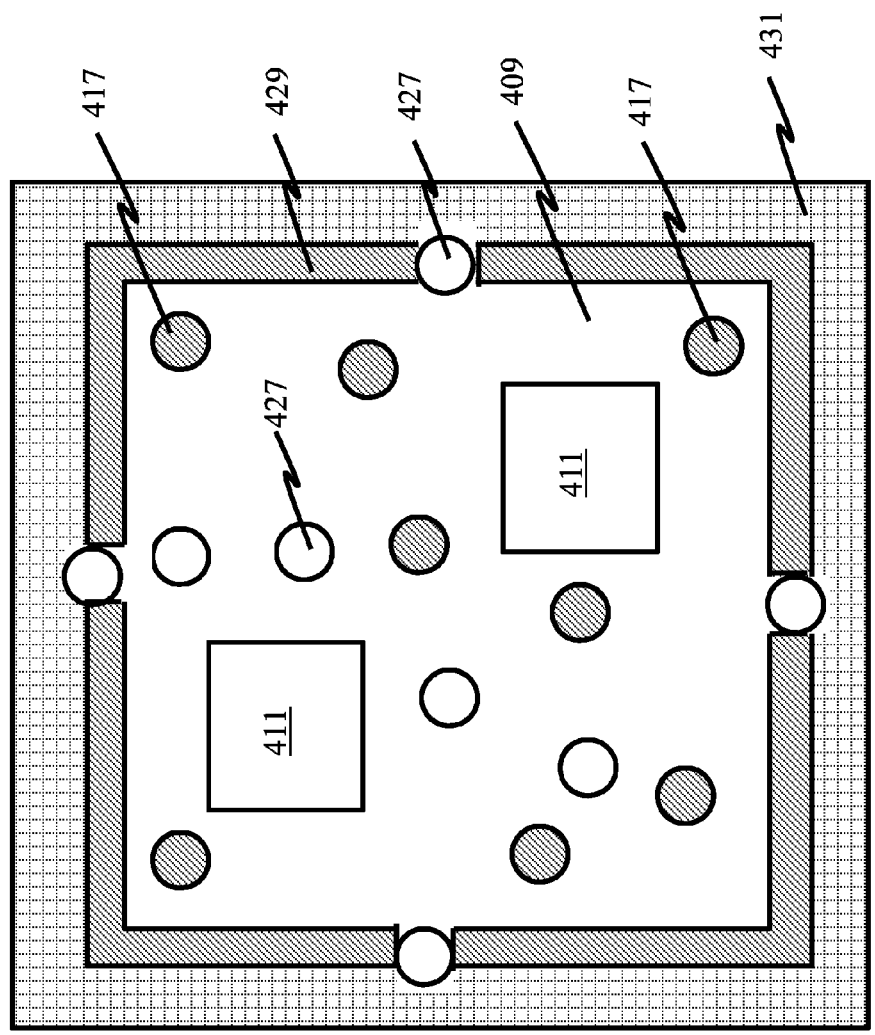

FIG. 4G shows a top view of the EUV mask. As illustrated, the mask includes pattern areas 411 and empty area, or dummy fill area, 409 surrounded by a Si wall 429 formed in margin area 431 (at the outside of the mask, and outside the pellicle). Several pillars 417 (for example 3 to 1000) are formed in the empty area 409 to support the pellicle, and holes 427 are formed both in empty area 409 and in margin area 431. The number of holes may range from 3 to 1000. If there is not enough empty area in the center of the mask, then the pillars 417 and holes 427 in the empty area may be eliminated, leaving Si wall 429 and holes 427 in the margin area.

Since the number of holes is small, and since the diameter of the holes is on a sub mm scale, the chance of particles entering the enclosed space through the holes and landing on the EUV mask is limited. Nonetheless, since the holes are formed in an empty area outside a pattern area, a rugged grating or static random access memory (SRAM) pattern may be employed under the holes (not shown for illustrative convenience) to attract any particles that do manage to enter the enclosed space.

The embodiments of the present disclosure can achieve several technical effects, such as improved airflow between a space enclosed by an EUV mask, a frame, and a pellicle and the space outside the mask and pellicle, thereby protecting the pellicle from varying pressures. The present disclosure enjoys industrial applicability in any of various types of semiconductor devices, particularly for EUV technologies below 7 nm.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a frame around a patterned area on an extreme ultraviolet (EUV) mask;
   forming a membrane over the frame;
   forming holes in the frame to a width of 1 to 10,000 micrometers (μm); and
   forming holes in the membrane.

2. The method according to claim 1, comprising forming the holes in the frame and in the membrane by a litho-etch-litho-etch (LELE) process.

3. The method according to claim 1, comprising forming the frame, membrane, and holes by:
   forming a silicon nitride (SiN) layer on opposite surfaces of a silicon (Si) substrate;
   etching the SiN layer on the second surface, forming a pattern;
   etching the Si substrate through the pattern, forming an opening in the Si through to the SiN layer on the first surface and forming holes partially through the Si,
   wherein Si remaining after etching forms the frame, and a portion of the SiN layer on the first surface over the opening forms the membrane.

4. The method according to claim 3, wherein the opening and the holes are tapered.

5. The method according to claim 1 further comprising:
   forming a sacrificial layer over the EUV mask including over the patterned area;
   forming holes in the sacrificial layer, down to the EUV mask, between the frame and the patterned area; and
   forming pillars in the holes, prior to providing the membrane over the frame.

6. The method according to claim 5, further comprising:
   forming a hole in the membrane down to the sacrificial layer, between the frame and the patterned area; and
   removing the sacrificial layer.

7. The method according to claim 6, comprising removing the sacrificial layer by ion etching.

8. The method according to claim 6, comprising forming the sacrificial layer of a material having an etch selectivity different from the pillars, the frame, and the membrane.

9. The method according to claim 8, wherein the material comprises carbon (C), silicon dioxide ($SiO_2$), silicon nitride (SiN), or an organic material.

10. A device comprising:
    a frame around a patterned area on an extreme ultraviolet (EUV) mask;
    a membrane over the frame;
    holes in the frame having a width of 1 to 10,000 micrometers (μm); and
    holes in the membrane.

11. The device according to claim 10, wherein:
    the frame comprises silicon (Si); and
    the membrane comprises a silicon nitride (SiN) layer.

12. The device according to claim 11, wherein the holes are tapered, the device further comprising a tapered opening in the silicon over the patterned area.

13. The device according to claim 10, further comprising pillars between the frame and the patterned area.

14. The device according to claim 13, wherein the number of pillars ranges from 3 to 1000.

15. The device according to claim 10, wherein the membrane comprises a layer of Si or SiN between two layers of ruthenium (Ru).

16. A method comprising:
    forming a frame around a patterned area on an extreme ultraviolet (EUV) mask;
    forming a sacrificial layer of carbon (C), silicon dioxide ($SiO_2$), silicon nitride (SiN), or an organic material over the EUV mask including over the patterned area;
    forming holes in the sacrificial layer, down to the EUV mask, between the frame and the patterned area;
    forming pillars in the holes;
    forming a pellicle over the frame, the pellicle comprising a silicon (Si) or SiN layer between two ruthenium (Ru) layers;
    forming a hole in the pellicle down to the sacrificial layer between the frame and the patterned area; and
    removing the sacrificial layer by ion etching through the hole; and
    forming additional holes in the pellicle and in the frame.

* * * * *